Aug. 13, 1968 JAMES E. WEBB 3,397,094

ADMINISTRATOR OF THE NATIONAL AERONAUTICS AND SPACE ADMINISTRATION

METHOD OF CHANGING THE CONDUCTIVITY OF VAPOR DEPOSITED GALLIUM ARSENIDE BY THE INTRODUCTION OF WATER INTO THE VAPOR DEPOSITION ATMOSPHERE

Filed March 25, 1965

INVENTOR.
SIDNEY G. ELLIS

BY [signature]
Charles C. Wells
ATTORNEYS

United States Patent Office 3,397,094
Patented Aug. 13, 1968

3,397,094

METHOD OF CHANGING THE CONDUCTIVITY OF VAPOR DEPOSITED GALLIUM ARSENIDE BY THE INTRODUCTION OF WATER INTO THE VAPOR DEPOSITION ATMOSPHERE

James E. Webb, Administrator of the National Aeronautics and Space Administration, with respect to an invention of Sidney G. Ellis, Princeton, N.J.

Filed Mar. 25, 1965, Ser. No. 442,835
7 Claims. (Cl. 148—174)

ABSTRACT OF THE DISCLOSURE

A continuous method of forming a junction by chemical transport is disclosed by vaporizing a semiconductor source compound such as gallium arsenide and an impurity such as zinc. The gallium is transported to a heated substrate as a vaporous chemical transport compound in a carrier gas such as hydrogen by reaction with a chemical reagent such as water to form a gallium oxide. The gallium oxide combines with arsenic at the substrate surface to form a zinc doped epitaxial layer of gallium arsenide of first type of conductivity. A second layer of different conductivity is epitaxially grown to form a junction by changing the temperature of the substrate or by changing the water content of the carrier gas to a selected level.

Origin of the invention

The invention described herein was made in the performance of work under a NASA contract and is subject to the provisions of Section 305 of the National Aeronautics and Space Act of 1958, Public Law 85–568 (72 Stat. 435; 42 USC 2457).

Background of the invention

This invention relates to the production of semiconductors having p- and n-type layers that form p-n junctions, and more particularly to a novel and improved method whereby either p- or n-type layers can be grown from a single source of semiconductor material, such as gallium arsenide.

A complex technology has been built up around the preparation of semiconductor materials. This technology relates first to the preparation of materials, followed by the purification and controlled impurity addition to the materials thus prepared, and finally the fabrication of semiconductor devices from the processed materials. In the production of semiconductor devices there is the problem of making single-crystal alloys from semiconductor materials in a closely controlled enviroment. Ancillary to this problem is the requirement to control the addition of impurities or doping agents. Despite the best efforts of many workers to remove the elements of art from this field, present technology still involves many empirical procedures.

The present invention relates to a positive method of control of doping agents in semiconductor fabrication and describes a novel process which has general application to control of doping agents.

The active region of many modern semiconducting and amplifying devices is the p-n junction. The p-n junction is a boundary between two parts of a semiconductor, the one of which is the p-type or hole conducting, the other the n-type or electron conducting. There are many ways of producing such junctions for these devices, some of which are more practical than others. To make a good p-n junction device, both the electrical characteristics (resistivity, type, mobility, and lifetime) and the geometry of the junctions must be kept under close control. Junction fabrication methods may be divided into two general classes: (1) methods (grown junctions) in which the impurities leading to the desired properties are incorporated into the crystal during growth, and (2) method involving treatment of a piece of homogenous crystal so as to create the desired regions of conductivity in secondary processes. The first method has the advantage of producing junctions with superior properties in some instances. Also, in the first method growth and part of the processing are achieved in one step rather than two. However, this method has the disadvantage that it is somewhat inflexible in the geometry of the junction produced, since proper crystal structure is so important that the conditions of growth must be closely controlled.

The present invention is related to control of the doping of semiconductor crystals grown by transport reaction.

Recent interest in new and improved semiconductor devices has suggested renewed investigations into the formation of junctions by epitaxial growth techniques. The term epitaxial growth is understood to mean the deposition of one material upon a substrate material under the condition that the deposited material is a continuation with similar orientation of the substrate crystal structure. By means of such a technique it is possible to fabricate straight, abrupt junctions with almost step changes in carrier concentration at junctions between dissimilar materials. These structures can be utilized in certain type of transistors for the improvement of high frequency and amplification characteristics. The novel method for control of doping by side reaction, in accordance with the present invention, to be described hereinafter, permits epitaxial deposition to be achieved since it involves the chemical transport of the semiconductor material onto a suitable substrate. In the present invention, the impurity transport is reduced or increased by the introuction of a new chemical reagent, or by changing the concentration of the transporting agent. This side reaction permits selective control of the doping process.

It is, therefore, a principal object of the invention to provide novel and improved methods for the production of n-type and p-type junctions.

It is an object of the invention to provide novel and improved methods for selectively controlling the rate of transport or incorporation of impurities employed in doping semiconductor materials by transport reactions.

Another object of the invention is to provide novel and improved means for the control of doping of semiconductor crystals grown by transport reaction.

Still another object of the invention is to provide novel and improved means for the formation of semiconductor junctions utilizing transport by hydrogen having a controlled water content, down a temperature gradient, in a two-zone furnace flow system.

Still another object of the invention is the formation of semiconductor junction employing oxide transport in the presence of hydrogen.

These and other objects of the invention will be understood more completely from the following detailed description, taken in conjunction with the drawings, in which.

Hereinafter, the following conventional symbols will be used to represent their irrespective elements:

| | |
|---|---|
| Arsenic | As |
| Cadmium | Cd |
| Gallium | Ga |
| Hydrogen | H |
| Manganese | Mn |

| | |
|---|---|
| Oxygen | O |
| Phosphorus | P |
| Tellurium | Te |
| Tungsten | W |
| Zinc | Zn |

There exist many processes where a semiconductor, hereinafter identified as S, is reacted with a transport agent, hereinafter identified as A, at a first temperature $T_1$ to form a volatile compound. This compound is subsequently decomposed in a reaction vessel at a second temperature $T_2$ to deposit the semiconductor at a second location on some suitable substrate. This may be shown symbolically as:

$$S+A \xrightarrow[T_1]{} S.A. \xrightarrow[T_2]{} S+A$$

The impurities, hereinafter identified as I, present in the source crystal or crystals of S may or may not be transported by the transport agent A. For example, either the reaction:

$$I+A \xrightarrow[T_1]{} IA$$

or the reaction:

$$IA \xrightarrow[T_2]{} I+A$$

may not occur. In this case, it is possible to purify the semiconductor by the removal of this impurity. In this instance, it is assumed that the impurity is either nonvolatile or else sufficiently volatile that it escapes from the system.

The present invention is based upon a system in which both S and I are transported by transport agent A but in which the *rates* of transport depend in a different functional way on the concentration (A) of A in the reaction vessel. By changing (A) it will be possible to change the concentration of I in the depositing semiconductor. Examples of this novel technique will be given hereinafter.

If the impurity I is a donor, and if the growing crystal tends to be p-type irrespective of (A) then it will be possible to switch it from an n-type to a p-type during growth by a sudden change in (A). This reaction may be more clearly understood by considering the following example:

Example I

The growth of gallium arsenide (GaAs) may be represented by the following reaction:

$$2GaAs+O \xrightarrow[850^\circ\text{ C.}]{} Ga_2O+\tfrac{1}{2}As_4 \xrightarrow[800^\circ\text{ C.}]{} 2GaAs+O$$
$$\text{vap.}$$

Where O is the symbol for oxygen and (O) is the concentration of oxygen.

Under these conditions, and with (O) fixed by the low residual partial pressure of water in the system, a zinc or cadmium doped ($10^{18}$ cm.$^{-3}$) source crystal will yield a p-type deposited layer on a tungsten substrate.

If now the partial pressure of water in the reaction vessel is increased by bubbling the vessel's atmosphere (hydrogen in Example I) through water at 0° C. or 23° C., the rate of deposition increases and the deposited GaAs is n-type.

Figure 1:
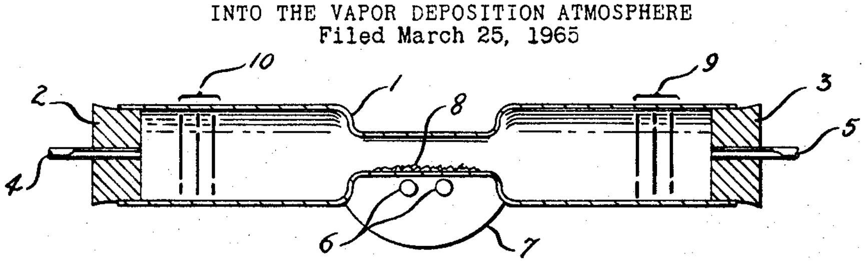
FIGURE 1 is a somewhat diagrammatic cross section view of apparatus useful in carrying out the process of the invention.

There is shown in FIGURE 1 an apparatus suitable for carrying out the method of invention. This comprises a refractory environment-controlling vessel shown as a quartz tube 1 sealed at each end by stoppers 2 and 3, and having inlet 4 and outlet 5 for a flow of gas as will appear hereinafter. The central region of vessel 1 is heated by a quartz-iodine lamp 6 mounted in a semi-cylindrical reflector 7. The center section of tube 1 is flattened to provide an area for receiving the semiconductor material 8. The source material 8 may comprise a crystal or crystals which are positioned between the heat lamp 6 and the substrate (not shown) so that the substrate is cooler than the source material 8. Stoppers

2 and 3 may be of neoprene and are shielded from the hot zone by radiation shields 9 and 10.

In the case of Example I, the substrate on which the film is to be formed is positioned near a gallium arsenide source crystal in the reaction vessel 1, hereinafter referred to generally as the furnace. Either dried hydrogen or hydrogen of controlled water content, as will be discussed more fullly hereinafter, is supplied through inlet 4 and exhausted through outlet 5. The source GaAs crystal is then heated to a temperature in the range of 400° C. to 900° C. and the substrate will be at some temperature lower than source 8. It is believed that the gallium is transported to the cooler substrate as an oxide which reduces there in accordance with the following reversible reaction:

$$2Ga+H_2O \rightleftharpoons Ga_2O+H_2$$

and that the arsenic is transported as the vapor.

In Example I dry hydrogen is supplied to the furnace from a suitable source. If hydrogen containing controlled water content is to be employed, the hydrogen from the source may be made to pass through a U-tube containing water at 0° C. or 23° C. The outlet 5 may be connected to a bubbler and then externally vented in a suitable manner. During operation, the preferred flow rates are of the order of 1 milliliter per second or less.

Figure 2:
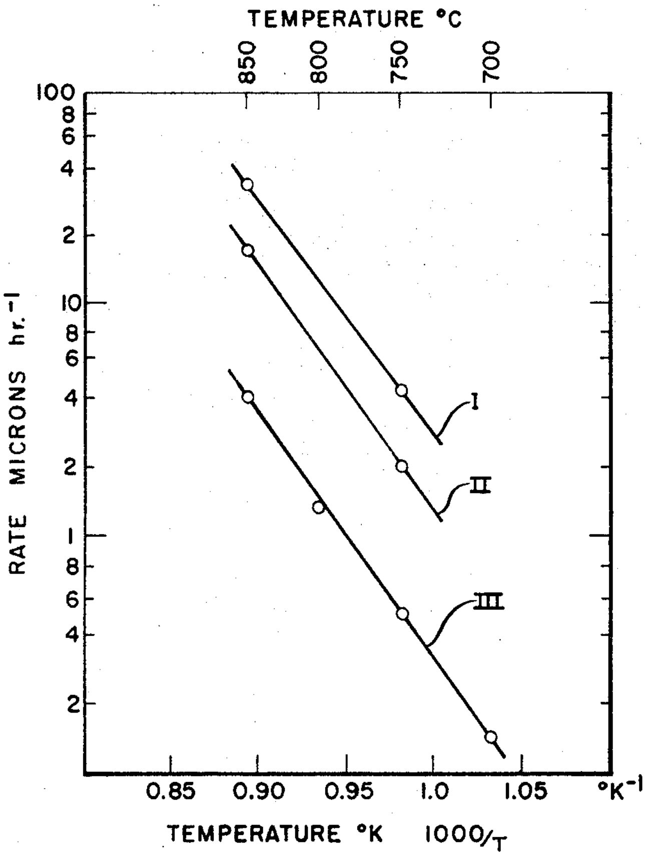
FIGURE 2 is a chart which graphically illustrates the rate of film formation under various process conditions.

The chart in FIGURE 2 illustrates the rate of film formation as it relates to source crystal temperature and water vapor concentration. In this chart, film deposition rate in microns per hour is indicated along the vertical axis. Temperature in degrees centigrade appears along the top horizontal axis, and reciprocal absolute temperatures or 1000 over degrees Kelvin is indicated along the bottom horizontal axis. The curve identified as I illustrates a film deposition rate for the case in which hydrogen passed through water at 23° C. is employed. Curve II illustrates the film formation rate when using hydrogen passed through water at 0° C., and Curve III illustrates rate of film formation using driest hydrogen. The film thicknesses shown are mean values derived from the weight of the deposit. All points were obtained using the same source crystal. The transfer rate is also a function of the crystallographic orientation of the source crystal. The growth rates illustrated in FIGURE 2 approach maximum values since the further addition of water vapor tends to result in excessive oxidation of the source crystal.

The continuity of the film depends on having a high density of nucleation sites so that the crystals grow into contact while the film is still thin. The density of nucleating sites depends on the substrate, its pre-treatment, and its temperature. The choice of substrates is limited by the chemical reactivity of gallium arsenide when hot. The following have been found to be satisfactory.

(i) Sheet tungsten, electropolished, either with degreasing before use or hydrogen firing at 800° C. immediately before deposition.

(ii) Sheet molybdenum.

(iii) Quartz.

(iv) All of the above, precoated by the vacuum deposition of less than 1 micron of germanium at a substrate temperature in the range 600° C.–800° C. This greatly increases the nucleation density at a given temperature.

(v) Tungsten or molybdenum precoated by the vacuum deposition of less than one micron of manganese (at 600° C.) or aluminum (at 300° C.). These pretreatments also yielded a high nucleation density.

It has been found that molybdenum substrates are preferred since they provide a better thermal expansion match to gallium arsenide than do tungsten substrates.

One aspect of the invention resides in controlling the conductivity type of the continuous gallium arsenide films grown in accordance with the above-mentioned process. The doping of gallium arsenide grown from a vapor phase is a complex phenomena much affected by chemical reactions between the dopant and other chemical species present in the system. Techniques of the prior art developed in connection with melt doping have not been found to be dependable guides in achieving the objectives of the present invention.

At substrate temperatures less than 450° C. all deposits were n-type, independent of substrate and source material. At substrate temperatures in the range of 550° C. to 700° C. a Zn doped source will give p-type layers on Mo or Ge covered susbtrates in dry hydrogen. Under these conditions a tellurium-doped source gives n-type layers on Ge coated substrates. While the Zn doped source gave p-type layers on Ge covered substrates at the higher temperatures in dry hydrogen, it gave an n-type layer if the hydrogen was bubbled through water at room temperature.

Thus, it is possible for the present invention to deposit n- or p-type layers at will.

There follows two examples of producing layers with junctions:

Example II

Using a Mn-on-Mo substrate at a temperature of 600° C., a p-type film was grown from a zinc-doped source. At substrate temperatures in the range of 550° C. to 700° C. a zinc-doped source will give p-type layers on Mn or Ge covered substrates in dry hydrogen. Thereafter, the hydrogen entering the furnace was bubbled through water at 23° C. and an n-type layer was formed.

Example III

Using a Ge-on-Mo substrate p-on-n layers of zinc-doped source were grown by first maintaining the substrate temperature at less than 450° C. to form the n-type layer, and thereafter increasing the substrate temperature to 550° C. to 700° C. to give a p-type layer. Tin dots, 0.020″ in diameter were pressed onto the surface to provide connection to an external circuit. This produced a photovoltaic junction device capable of generating open circuit voltages up to 0.35 volt.

Example IV

The second method of making junction structures according to the invention involves changing the partial pressure of water during the deposition. In this method of making a p-n structure a p-type layer was grown from a zinc-doped crystal at 850° C. using a germanium-on-tungsten substrate and a dry hydrogen atmosphere. After 20 hours the temperature was lowered to 750° C. (so that later the previous growth rate would be restored) and the hydrogen was redirected to bubble through water at room temperature (23° C.). Growth was continued for another two hours. The added water vapor caused an n-type layer to form on the previously grown p-type layer resulting in a photovoltaic junction. At places where the n-type layer was sufficiently thin, electrical characteristics similar to Examples II and III were obtained.

Summarizing, the source crystal is heated to a temperature at which the crystal reacts. The resultant species is transported to a cooler region and decomposed to a layer on a suitable substrate, which may, for example, comprise tungsten, or germanium-on-tungsten. The source crystal and substrate are placed in the furnace with only a few mils separation. The source crystal is positioned between the heat source and the substrate so that the substrate is cooler than the source crystal. The furnace heat is supplied by a heat lamp positioned closely adjacent to the reaction vessel. The atmosphere during this period of the process is dry hydrogen and a p-type layer is deposited on the substrate. The process is continued until a p-type layer of desired thickness is deposited. The hydrogen being supplied to the reaction vessel (furnace) is then redirected so that it is then bubbled through water at 0° or 23° C. prior to arriving at the furnace. This increase in the partial pressure of water in the furnace's hydrogen atmosphere results in an n-type layer being deposited on the previously deposited p-type layer and thus forms a semiconductor material having a p-n junction.

The advantage of the method described above is that the deposit can have its conductivity type changed or programmed without stopping the crystal growth process so that the n- and p-type layers are epitaxial with respect to each other.

Since certain changes may be made in the above methods, processes, and devices without departing from the scope of the invention herein involved, it is intended that all matter contained in the above description or shown in the accompanying drawings shall be interpreted as illustrative and not in a limiting sense.

What is claimed is:

1. The method of making a semiconductor junction device comprising the steps of:

maintaining a temperature gradient between a source of gallium arsenide and a substrate upon which said material is to be deposited, in a reaction vessel, said temperature gradient being sufficient to generate a vapor of said source material;

simultaneously providing a dopant in said vapor which will impart a first conductivity to a deposited layer of gallium arsenide;

and further simultaneously providing a dry hydrogen environment in said vessel by means of a continuous flow of dry hydrogen therethrough to transport said vapor to said substrate; and thereafter introducing water into said hydrogen atmosphere to change the conductivity of the deposited material, and continuing the deposition until a gallium arsenide layer of opposite conductivity is formed.

2. A method according to claim 1 in which an n-type layer of zinc doped gallium arsenide is first grown at a substrate temperature of less than 450° C. from a zinc doped gallium arsenide source reacted with water in hydrogen gas to form a gallium oxide transport compound and arsenic and the substrate temperature is then raised to 550° C. to 1000° C. to form a p-type layer.

3. The method defined in claim 1 including the step of:

pressing an electrical contact onto the exposed surface of said junction device.

4. The method as defined in claim 1 wherein said substrate comprises material selected from the group consisting of:

tungsten
molybdenum
silicon
germanium
manganese
aluminum.

5. A method according to claim 1 in which the doping impurities are selected from zinc, cadmium and tellurium.

6. A method according to claim 5 in which the impurity is present in an impurity doped source compound.

7. A method according to claim 1 in which the partial pressure of water in the hydrogen gas is increased to a selected level by bubbling the hydrogen through water at a constant temperature of 0° C. to 23° C.

References Cited

UNITED STATES PATENTS

| | | | |
|---|---|---|---|
| 3,009,834 | 11/1961 | Hanlet | 148—174 |
| 3,145,125 | 8/1964 | Lyons | 148—175 |
| 3,189,494 | 6/1965 | Short | 148—174 |
| 3,192,083 | 6/1965 | Sirtt | 148—175 |
| 3,197,411 | 7/1965 | Frosch | 148—175 |

OTHER REFERENCES

Glang et al.—"Article in Metallurgy of Semiconductor Materials"—vol. 15, Interscience Publishers, Aug. 30–Sept. 1, 1961, pp. 27–42. In particular pp. 37–42.

L. DEWAYNE RUTLEDGE, *Primary Examiner.*

P. WEINSTEIN, *Assistant Examiner.*